United States Patent [19]

Sloane

[11] Patent Number: 4,740,776
[45] Date of Patent: Apr. 26, 1988

[54] APPARATUS FOR COMPENSATING DIGITAL TO ANALOG CONVERTER ERRORS

[75] Inventor: Edwin A. Sloane, Los Altos, Calif.

[73] Assignee: Fairchild Camera & Instrument Corporation, Mountain View, Calif.

[21] Appl. No.: 542,286

[22] Filed: Oct. 14, 1983

Related U.S. Application Data

[63] Continuation-in-part of Ser. No. 204,979, Nov. 7, 1980, Pat. No. 4,419,656.

[51] Int. Cl.$^4$ .................. H03M 1/06; H03M 1/66
[52] U.S. Cl. .................. 340/347 DA; 340/347 CC
[58] Field of Search .................. 340/347 DA, 347 CC

[56] References Cited

U.S. PATENT DOCUMENTS

| | | | |
|---|---|---|---|
| 4,070,665 | 1/1978 | Glennon | 340/347 DA |
| 4,412,208 | 10/1983 | Akazawa | 340/347 CC |
| 4,465,996 | 8/1984 | Boyacigiller | 340/347 DA |

FOREIGN PATENT DOCUMENTS 0037363  4/1978  Japan .................. 340/347 CC

Primary Examiner—Charles D. Miller
Attorney, Agent, or Firm—David H. Carroll; Robert C. Colwell; Charles E. Krueger

[57] ABSTRACT

A high precision digital to analog converter comprises the combination of an imperfect or low resolution digital to analog converter having an error function known in terms of orthonormal components and an error compensating device capable of generating correction terms which do not interact with one another. The correction terms are based on orthonormal components namely, the Walsh function components, of each signal level to be compensated. At most only one weighting value per bit is required, the combination of which will compenate for errors of any bit combination. In a specific embodiment employing feedforward compensation, the output of the low resolution converter and of the compensating device may be summed to produce a high performance, high precision converter with increased accuracy and resolution. In other specific embodiments, the compensating device responds to selected digital bit inputs to produce an analog output which is summed at an intermediate summing junction with the analog signal of the converter.

7 Claims, 2 Drawing Sheets

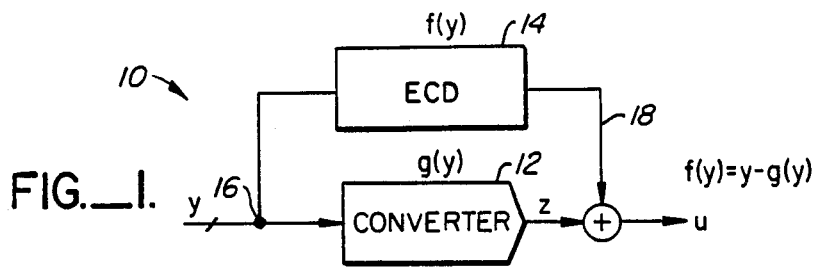
FIG._1.
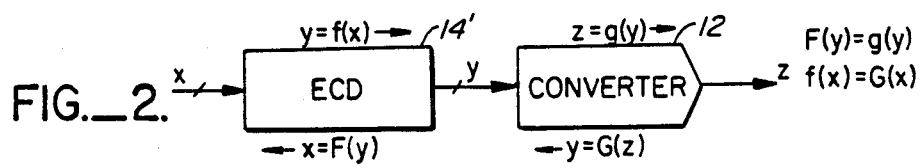
FIG._2.
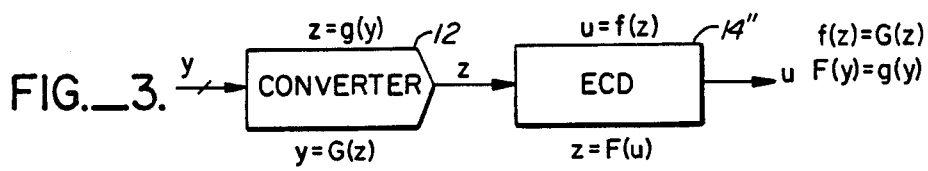
FIG._3.
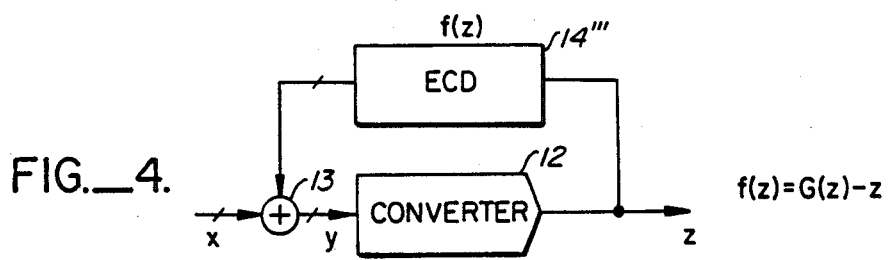
FIG._4.
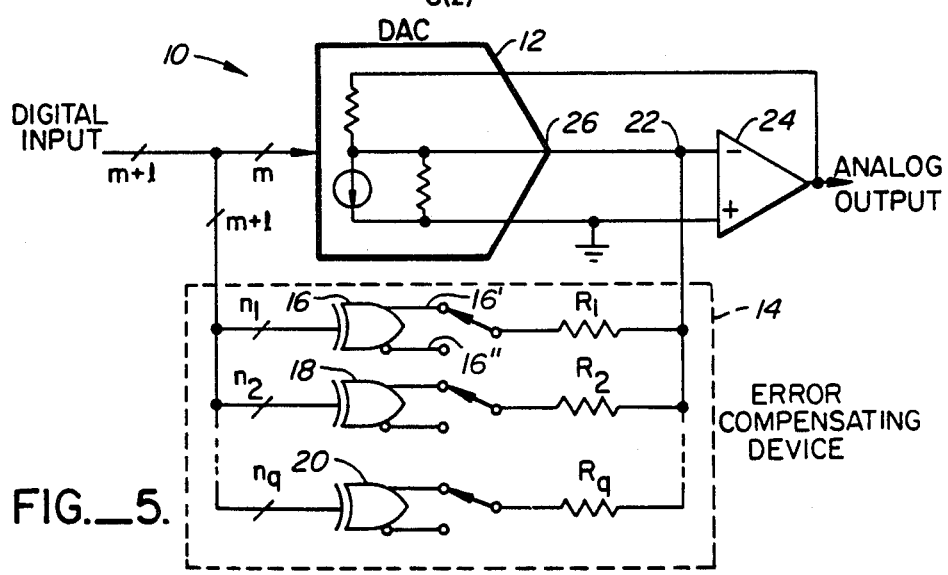
FIG._5.

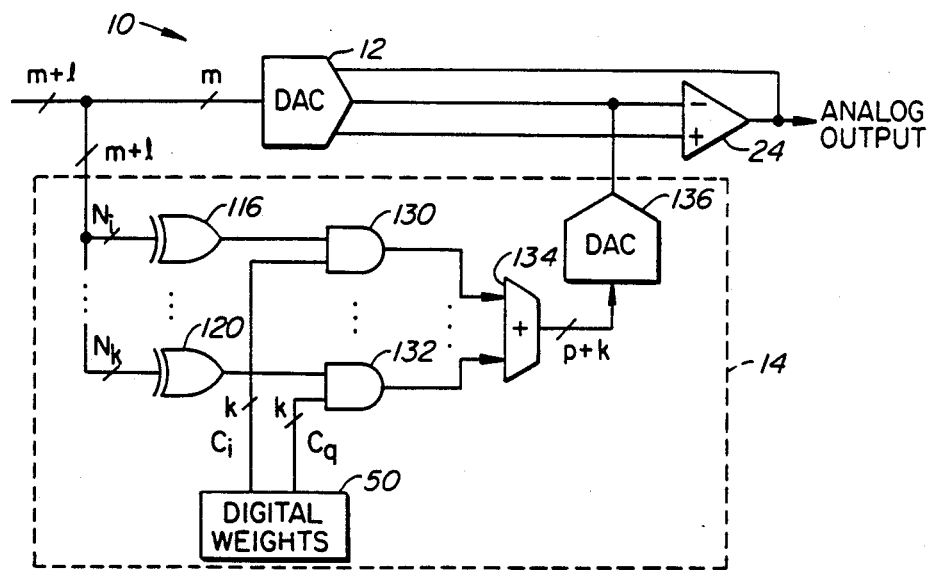
FIG._6.
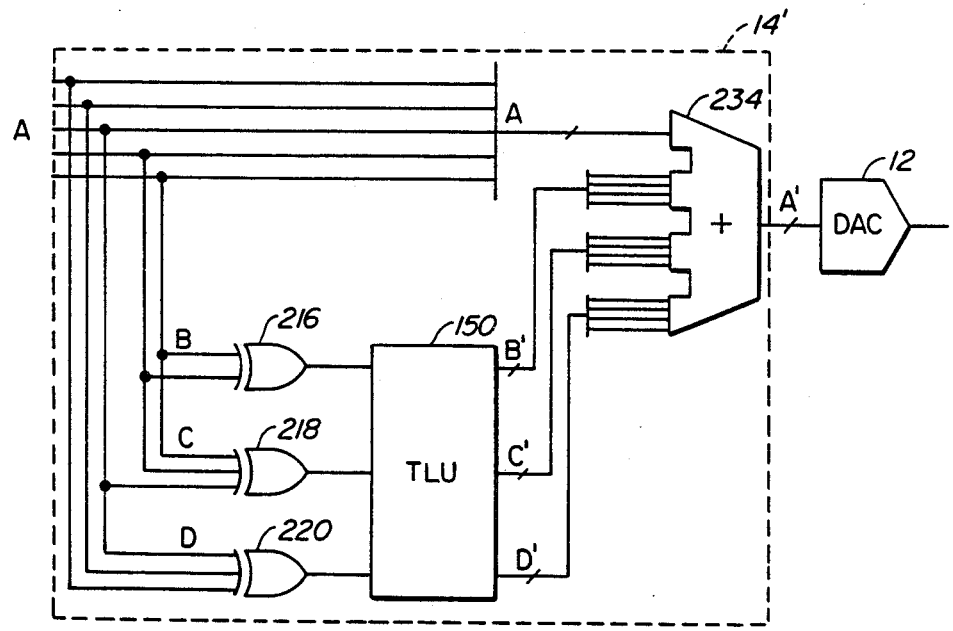
FIG._7.

APPARATUS FOR COMPENSATING DIGITAL TO ANALOG CONVERTER ERRORS

This application is a continuation-in-part of allowed co-pending U.S. patent application Ser. No. 204,979, filed Nov. 7, 1980 now U.S. Pat. No. 4,419,656.

Cross reference is also made to co-pending U.S. patent application Ser. No. 364,374, filed Apr. 1, 1982 now U.S. Pat. No. 4,465,995 and U.S. Pat. Nos. 4,335,373, issued June 15, 1982 and 4,354,177, issued Oct. 12, 1982. The subject matter of each of which is incorporated by reference and made a part hereof. Reference is also made to concurrently filed U.S. application Ser. No. 542,302.

BACKGROUND OF THE INVENTION

1. Field of the Invention

This invention relates to digital electronic converters and particularly to methods and apparatus for converting digital signals into analog signals.

Converters between digital and analog domains are employed to interface between digital electronic circuitry and devices requiring analog signals. Accuracy of conversion, gain and repeatability in the process of conversion are matters of concern which are important to evaluate and for which compensation is frequently required.

Precision converters are needed for critical conversion applications. However, precision converters are generally expensive and difficult to implement. Reasonable cost, commercial quality converters frequently suffer from errors in conversion which render them unusable for critical applications. What is needed is a technique for increasing the accuracy of reasonably reliable commercially available converters so they can be used even in critical applications.

2. Description of the Prior Art

Trimming techniques for analog to digital and digital to analog converters have been suggested for limited purposes. For example, L. F. Pau, "Fast Testing and Trimming of A/D and D/A Converters in Automatic Test Systems", 1978, IEEE Auto Test Conference, has suggested a method for trimming converters based on the use of Walsh functions. A more generalized proposal for correction of converter errors based on Walsh functions is described in J. T. Millman, "Error Minimization of Data-Converting Systems via Generalized Spectral Analysis," Ph.D. Thesis, Massachusetts Institute of Technology, submitted Aug. 21, 1975 (available Oct. 27, 1975). Specifically, Millman suggests the use of on-the-converter error-correction circuitry employing Walsh functions which can be generated through the use of EXCLUSIVE OR functions under control of a programmable read only memory. Millman suggests incorporation of correction circuitry into the original design and layout of a digital to analog converter and specifically the provision of fine control of the current-setting resistor internal to the digital to analog converter. However, Millman recognized the infeasibility of implementing on-the-converter correction circuitry for any interactive Walsh function errors in existing circuitry. Millman's work has been limited to internal compensation and has made no suggestion for alternative solutions.

Intersil, Inc. of Cupertino, Calif. manufactures a correcting digital to analog converter device under the trade name ICL 7134. The ICL 7134 is a multiplying digital to analog converter which has a programmable read only memory array for controlling a 12 bit correcting digital to analog converter in the same device. The structure allows for modulo-32 cyclical corrections to be applied to the signal output. However, with the Intersil device, it is very difficult to correct for nonlinearities in the analog output because all digital input functions are interrelated. Furthermore, only a group of the most significant bits are used for error correction so that significant errors involving the lower significant bits are potentially ignored.

SUMMARY OF THE INVENTION

According to the invention, a high precision digital to analog converter comprises the combination of an imperfect or low resolution digital to analog converter having an error function known in terms of orthonormal components and an error compensating device capable of generating correction terms which do not interact with one another. The correction terms are based on orthonormal components, namely, the Walsh function components, of each signal level to be compensated. At most only one weighting value per bit is required, the combination of which will compensate for errors of any bit combination. In a specific embodiment, the output of the low resolution converter and of the compensating device may be summed to produce a high performance, high precision converter.

In specific embodiments, the compensating device responds to selected digital bit inputs to produce an analog output which is summed at an intermediate summing junction with the analog signal of the converter. Each digital input signal is decomposed and analyzed by Walsh function expansion of the input. The respective Walsh function expansions are to then compensate for the error components, and a corresponding compensation signal is added to the intermediate analog output signal of the converter. The error compensation signal is generated by a suitable inverse transformation using logical combinatorial operations on the digital input code.

In one specific embodiment of the invention, a plurality of EXCLUSIVE OR gates is coupled to receive a plurality of selected bit signal inputs. Each such gate then drives a single pre-adjusted resistor whose value is selected as an analog signal weighting element to produce the analog compensating signal. In another embodiment, the weighting element is a digital table look-up device coupled to AND gates coupled to a digital adder. The outputs of EXCLUSIVE OR gates and the table look-up device are coupled to selected input bit lines of the AND gates. The table look-up device defines the weighting. The digital adder combines the weighting signals for each level. The output signal in turn is converted to a defined analog output signal by means of a correcting digital to analog converter.

The combination of the EXCLUSIVE OR gates with weighting resistors or with a table look-up device minimizes the number of circuit components. To this end, the EXCLUSIVE OR gates decode the digital input based on an analysis of the error function associated with the particular converter and particular error function.

In another embodiment, the error compensating device may be coupled serially in the digital input of the converter and be provided with digital weighting. Alternately, it can be provided with analog weighting and analog to digital conversion may be employed to provide a digital signal suitable for driving the digital input of the converter to be compensated.

The error correcting device may also be placed serially in the output of the converter with analog correction to the analog signal or with digital correction having digital to analog conversion of the compensating signal. Finally, the compensating device may be placed in feedback connection from the analog output of the converter to the digital input to the converter to provide digital weighting based on a sensed analog signal output.

The preferred embodiment employs an error correcting device in feedforward connection with the digital to analog converter wherein digital signals are converted to analog signals and then weighted and added to the intermediate analog signal generated by the converter.

The invention will be better understood by reference to the following detailed description taken in connection with the accompanying drawings.

BRIEF DESCRIPTION OF THE DRAWINGS

FIG. 1 is a block diagram of a device according to the invention wherein feedforward pre-correction is employed.

FIG. 2 is a block diagram of the invention wherein serial pre-correction is employed.

FIG. 3 is a block diagram of the invention wherein serial post-correction is employed.

FIG. 4 is a block diagram of the invention wherein feedback correction is employed.

FIG. 5 is a block diagram of a specific embodiment of a feedforward correction network according to the invention.

FIG. 6 is a block diagram of a second specific embodiment of the invention wherein feedforward correction is employed.

FIG. 7 is a block diagram of a specific embodiment of the invention wherein serial pre-correction is employed.

DESCRIPTION OF SPECIFIC EMBODIMENTS

It is known that Walsh functions are well suited to the representation of memoryless transfer characteristics of mixed signal devices such as digital to analog converters. This is because the Walsh functions form a complete set of orthogonal two-state functions capable of representing any reasonable function spanning a multiple of a binary number of intervals. As a consequence, all compensating functions based on the orthogonal binary functions are independent of one another and hence do not interact in any potential adjustment or correction scheme. However, Walsh functions are but one example of an orthonormal set of digital function upon which correction signals may be based. Reference is made to the copending parent application for a discussion of such functions.

Referring to FIG. 1, there is shown one embodiment of a digital to analog converter system 10 according to the invention comprising a digital to analog converter 12 having a known error characteristic or error function and a compensating device 14. The compensating device 14 responds to the same digital input at an input node 16 as the converter 12 and produces an analog output on an analog signal line 18 as an analog compensating signal. The function of the converter 12 may be expressed as g(y) which produces an analog intermediate signal z in response to a digital input signal y. The error compensating device 14 may be expressed as a function f(y). The function f(y) is specifically tailored to produce a value equal to the value y−g(y) expressed in analog terms at its output. The sum of the analog correction signal and the analog intermediate signal is a value u which is the desired output signal in analog form. The u valued signal in a properly designed system 10 is a properly scaled analog equivalent of the digital input y.

Referring to FIG. 2, there is shown another possible configuration for an apparatus according to the invention.

In this embodiment a signal x is applied to an error compensating device 14' which produces an output signal y which is a function of f(x) which in turn is applied to a converter 12 having a function g(y) to produce an analog output z. This scheme is called serial pre-correction. Since the value x is the digital equivalent of the analog value z, the inverse transform of the error compensating device 14' is equal to the forward transfer function g(y) of the converter 12. Also the forward function f(x) of the error compensating device 14' is equal to the inverse transfer function G(x) of the converter 12.

FIG. 3 illustrates serial post-correction wherein the converter 12 applies its analog output z to an error compensating device 14''. In this case, the forward function of the error compensating device 14'' f(z) is equal to the reverse function G(z) of the converter 12, and the reverse function F(y) of the error correcting device 14'' is equal to the forward function g(y) of the converter 12.

FIG. 4 illustrates a feedback technique for correcting converter output. The error compensating device 14''' receives as an analog input the output of the converter 12 and provides a digital output to a digital adder 13. The adder 13 adds a digital signal to the digital input signal, the sum of which is applied to the input of the converter 12. In feedback techniques, the digital input signal x is equal to the analog output signal z if the reverse function G(z)−z of the converter 12 is equal to the forward function f(z) of the error compensating device 14''' so that the value y at the input to the converter 12 is equal to the sum of the value x and the value f(z). The function of the error compensating network 14''' is the difference between the converters inverse characteristic and the ideal linear characteristic.

Either the forward transfer characteristic of the converter 12 or the inverse function of the converter 12 must be known before compensation may be applied. The forward transfer characteristic may be obtained by uniformly varying the input to the device and observing the response to which Walsh domain filtering may be applied.

The inverse function may be obtained by using a uniformly distributed input function, y, so that:

$$p(y) = 1/Y$$

And noting that the density function of the response function is:

$$p(z) = p(y)\frac{dy}{dz} = \frac{1}{Y} G'(z)$$

so that $$G(z) = Y \int p(z) dz$$

In the case of ADC, G(z) might also be obtained by means of exponential excitation as described in the parent case.

Each of the compensating methods have preferred applicability to either ADC's or DAC's depending on the availability of the digital code. Consider for instance, the following input/output relationship:

$$z = g(y) = g(ny_o) = g(n)$$

Where the input, y, is uniformly quantized with increments of $y_o$. In terms of the Walsh functions:

$$z = \sum_{k=o}^{2^m-1} g_k \cdot \psi_k(n), \quad 2^m y_o = 1$$

where $$g_k = \sum_{n=o}^{N-1} g(n) \cdot \psi_k(n)$$

The output, z, at any given quantized input state, n, will be the weighted sum of all the significant Walsh terms. The set of weights, $(g_k)$, will be either added or subtracted depending on the sign of the Walsh functions, $\{\Psi_k(n)\}$, at state n. Because the state of the binary order Walsh functions, $\{\Psi_{2l}(n)\}$, is known from the input state n, i.e., the corresponding binary input code indicates the sign of the binary ordered functions, the sign of any other (non-binary) Walsh function may be determined by means of the generating rule. Thus;

$$\psi_{k \oplus l}(n) = \psi_k(n) \cdot \psi_l(n)$$

If $k \neq l$ and both are of binary order, $$\psi_{k+l}(n) = \psi_k(n) \cdot \psi_l(n)$$

And the sign (signum) of the resultant will be;

$$\text{sgn }\{\psi_{k+l}(n)\} = \text{sgn }\{\psi_k(n)\} \cdot \text{sgn }\{\psi_l(n)\}$$

In general, the sign will be the product of the appropriate binary ordered Walsh functions which are determined by the binary code of the input state n.

The equivalent logical operation based on the logical (on-off) representation of the Walsh functions is:

$$\phi_{k \oplus l}(n) = \phi_k(n) \oplus \phi_l(n)$$

Where $\oplus$ represents the EOR operation, and $\phi$ is the logical complement of $\phi$. The availability of quantized data is an important consideration in the selection of a correction scheme for a digital to analog converter. A digital to analog converter has quantized inputs. Hence the methods of FIG. 1, feed forward correction, and of FIG. 2, serial pre-correction, are best suited for applications with digital to analog converters.

FIG. 5 illustrates a specific embodiment for a digital to analog converter device 10 having feed forward correction. In FIG. 5, a converter 12 is fed by m+1 bits of information, m bits of which are applied to the converter 12 and the m+1 bits being applied to the error compensating device 14. The error compensating device 14 comprises a plurality of EXCLUSIVE OR gates 16, 18, 20, for example, each receiving a different set of digital input bit lines $n_1, n_2 \ldots n_q$ of the m+1 input signals. The exact input bit line configuration is defined by the orthogonal components of error function associated with the converter 12. Each EXCLUSIVE OR gate 16, 18, 20 for example, EXCLUSIVE OR gate 16, is provided with TRUE input states on signal line set $n_1$ of one level to be corrected. The weighting of the signal line set is either added or subtracted (as indicated by alternative outputs of 16', 16'' of EXCLUSIVE OR gate 16), and the magnitude of the weighting is defined by a resistance of the corresponding EXCLUSIVE OR gate. $R_1$ corresponds to gate 16, $R_2$ corresponds to gate 18, and $R_q$ corresponds to gate 20. In the specific embodiment, the EXCLUSIVE OR gates 16, 18, 20 are each devices having an output suitable for driving the corresponding output resistor. The output resistors are in turn all coupled to summing junction 22 on an operational amplifier 24 with the output 26 of the converter 12. Whenever any one of the EXCLUSIVE OR gate outputs is true, an analog signal is generated representing the corresponding orthogonal component of the input digital signal. The analog signals add at the summing junction. The analog output of the operational amplifier 24 is the desired corrected analog output.

FIG. 6 illustrates a digital to analog converter device 10 with an alternative feed forward scheme using an error compensating device 14 with digital weighting. In this instance, EXCLUSIVE OR gates 116, 120 receive inputs as in FIG. 5, and the outputs thereof are applied to AND gates 130, 132. Each of the AND gates 130, 132 receives a pre-set digital input from a table look-up device 50. The outputs of the AND gates 130, 132 are all applied to a digital adder 134 so as to add, digitally, the weights for the corresponding input state. The output of the adder 134 is applied to a correcting digital to analog converter 136 forming a part of the error compensating device 14. The output of the correcting converter 136 is added to the output of the converter 12 at a summing junction of op amp 24. The analog output of the op amp 24 is the desired compensated output signal.

Pre-serial correction is best implemented in digital form. In FIG. 7, an error compensating device 14' receives a digital signal input A and provides a corrected digital signal output A' to the converter 12 to be compensated. EXCLUSIVE OR gates 216, 218, 220 receive selected inputs of bit sets B, C, D, of the input signal A and apply outputs to a table look-up device (TLU) 150 to produce weighted outputs B', C' and D' in accordance with the invention. The values A, B', C' and D' are added together at a digital adder 234 to produce the corrected digital output A' for application to the converter 12. The output of the converter 12 is the desired analog output signal.

The invention has now been explained with reference to the specific embodiments. Other embodiments will be apparent to those of ordinary skill in the art. For example, one of the advantages of a correction network as shown herein is that no more than one weighting factor per bit is required, since each weighting factor is determined by an analysis of the orthonormal characteristics of that bit with respect to all other bits. Simple EXCLUSIVE OR logical correcting networks have been found to require normally only pairs of input data bits, and generally 0, 1, 2 or 3 combinations of input bits for purposes of correction. Large complex networks are thus unnecessary, and correction networks can be incorporated into devices easily coupled together with ordinary digital to analog converters. Variable resistors may be used for weighting, the adjustments of which can be made empirically, based on an error function analysis by orthonormal components of the converter to be corrected. It is therefore not intended that this invention be limited except as indicated by the appended claims.

I claim:

1. An apparatus for converting a digital input signal to an analog output signal comprising:
   a digital-to-analog converter device having an analog signal conversion error responsive to said digital input signal to produce an analog output signal, said conversion error being known in terms of orthonormal components of the input signal;
   a signal error compensating device for producing a compensating signal specific to said conversion error and non-interacting with said digital-to-analog converter, comprising a plurality of EXCLUSIVE OR gates operative to combine selected ones of said digital input signal values into a plurality of error correcting signals, each error correcting signal corresponding to an orthonormal component of signals produced by said digital-to-analog converter device to be compensated, a weighting element, and a digital adder, said weighting element for producing said compensating signal, said weighting element comprising a digital look-up table and a plurality of AND gates, the selected outputs of said digital look-up table each being coupled through one AND gate with an output of a corresponding EXCLUSIVE OR gate to said digital adder, said digital adder being operative to generate said compensating signal; and
   means for correcting said analog output signal with said compensating signal to produce a compensated analog output signal.

2. An apparatus for converting a digital input signal to an analog output signal comprising:
   a digital-to-analog converter device having an analog signal conversion error responsive to said digital input signal to produce an analog output signal, said conversion error being known in terms of orthonormal components of the input signal;
   a signal error compensating device for producing a compensating signal specific to said conversion error and non-interacting with said digital-to-analog converter, comprising a plurality of EXCLUSIVE OR gates operative to combine selected ones of said digital input signal values into a plurality of error correcting signals, each error correcting signal corresponding to an orthonormal component of signals produced by said digital-to-analog converter device to be compensated, a weighting element and a digital adder, said weighting element for producing said compensating signal, said weighting element comprising a digital look-up table coupled to receive output of said EXCLUSIVE OR gates and to supply said digital adder, said digital adder being operative to combine digital output values to generate said compensating signal; and
   means for correcting said analog output signal with said compensating signal to produce a compensated analog output signal.

3. An apparatus for converting a digital input signal to an analog output signal comprising:
   a digital-to-analog converter device having an analog signal conversion error responsive to said digital input signal to produce an analog output signal, said conversion error being known in terms of orthonormal components of the input signal;
   a signal error compensating device for producing a compensating signal specific to said conversion error and non-interacting with said digital-to-analog converter and being coupled serially to the digital input of said digital-to-analog converter device, comprising a plurality of EXCLUSIVE OR gates operative to combine selected ones of said digital input signal values into a plurality of error correcting signals, each error correcting signal corresponding to an orthonormal component of signals produced by said digital-to-analog converter device to be compensated, a weighting element and a digital adder, said weighting element for producing said compensating signal, said weighting element comprising a digital look-up table coupled to receive output of said EXCLUSIVE OR gates and to supply said digital adder, said digital adder being operative to combine digital output values to generate said compensating signals; and
   means for correcting said analog output signal with said compensating signal to produce a compensated analog output signal.

4. An apparatus for converting a digital input signal to an analog output signal comprising:
   a digital-to-analog converter device having an analog signal conversion error for producing an analog intermediate signal, said conversion error being known in terms of orthonormal components of the input signal;
   an analog signal error compensating device responsive to said digital signal for producing an analog compensating signal specific to said conversion error and non-interacting with said digital-to-analog converter, operative to decompose said digital input signal into orthogonal components and further including an EXCLUSIVE OR means for combining values representing selected ones of said orthogonal components into a single correcting signal for each combination of bits to be compensated, and at least one weighting element, each weighting element coupled to receive one said correcting signal for producing a component of said analog compensating signal; and
   means for summing said analog intermediate signal and said analog compensating signal to produce said analog output signal.

5. The apparatus according to claim 4 wherein each said weighting element is a resistor, said resistor being driven by the output of said corresponding EXCLUSIVE OR means.

6. The apparatus according to claim 4 wherein said weighting element is a digital look-up table having individual outputs defining correction values, said digital look-up table being coupled through a combining network.

7. An apparatus for converting a digital input signal to an analog output signal comprising:
   a digital-to-analog converter device having an analog signal conversion error for producing an analog intermediate signal, said conversion error being known in terms of orthonormal components of the input signal;
   an analog signal error compensating device responsive to said digital signal for producing an analog compensating signal specific to said conversion error and non-interacting with said digital-to-analog converter, comprising a plurality of EXCLUSIVE OR gates operative to combine selected ones of said digital input signal values into a plurality of error correcting signals, each error correcting signal corresponding to an orthonormal component of signals produced by said digital-to-analog converter device to be compensated, a weighting element and a digital adder, said weighting element for producing said compensating signal, said weighting element comprising a digital look-up table and a plurality of AND gates, selected outputs of said digital look-up table each being coupled through one AND gate with an output of a corresponding EXCLUSIVE OR gate to said digital adder, said digital adder being operative to generate said compensating signal, and further including a supplemental digital-to-analog converter, said supplement digital-to-analog converter being coupled to receive the output of said digital adder for converting said digital compensating signal to an analog compensating signal; and means for summing said analog intermediate signal and said analog compensating signal to produce said analog output signal.

* * * * *